US006544656B1

United States Patent
Abe et al.

(10) Patent No.: US 6,544,656 B1
(45) Date of Patent: Apr. 8, 2003

(54) PRODUCTION METHOD FOR SILICON WAFER AND SILICON WAFER

(75) Inventors: Takao Abe, Annaka (JP); Ken Aihara, Annaka (JP); Shoji Akiyama, Annaka (JP); Tetsuya Igarashi, Takefu (JP); Weifeng Qu, Annaka (JP); Yoshinori Hayamizu, Annaka (JP); Shigeru Saito, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/674,841

(22) PCT Filed: Feb. 25, 2000

(86) PCT No.: PCT/JP00/01124

§ 371 (c)(1),
(2), (4) Date: Nov. 7, 2000

(87) PCT Pub. No.: WO00/55397

PCT Pub. Date: Sep. 21, 2000

(30) Foreign Application Priority Data

Mar. 16, 1999 (JP) .......................................... 11-070963
Aug. 27, 1999 (JP) .......................................... 11-241370

(51) Int. Cl.⁷ .............................................. C30B 29/06
(52) U.S. Cl. ...................... 428/446; 428/64.1; 117/3; 117/931
(58) Field of Search ............... 428/64.1, 446; 117/3, 13, 931; 148/33.5

(56) References Cited

U.S. PATENT DOCUMENTS

| 5,198,371 A | * | 3/1993 | Li .................................. 437/11 |
| 5,418,172 A | * | 5/1995 | Falster et al. ................... 437/8 |
| 5,419,786 A | * | 5/1995 | Kokawa et al. ............. 148/33.5 |
| 5,478,408 A | * | 12/1995 | Mitani et al. ............... 448/33.3 |
| 6,117,231 A | * | 9/2000 | Fusegawa et al. ............. 117/30 |

FOREIGN PATENT DOCUMENTS

| JP | 63-90141 | | 4/1988 |
| JP | 5-58788 | | 3/1993 |
| JP | 406252164 A | * | 9/1994 |
| JP | 7-235507 | | 9/1995 |
| JP | 7-312351 | | 11/1995 |
| JP | 8-10695 | | 1/1996 |
| JP | 9-190954 | | 7/1997 |
| JP | 9-251961 | | 9/1997 |
| JP | 10-150048 | | 6/1998 |
| JP | 10-163220 | | 6/1998 |

* cited by examiner

Primary Examiner—Deborah Jones
Assistant Examiner—Stephen Stein
(74) Attorney, Agent, or Firm—Oliff & Berridge, PLC

(57) ABSTRACT

A silicon wafer is produced by growing a silicon single crystal ingot having a resistivity of 100 Ω·cm or more and an initial interstitial oxygen concentration of 10 to 25 ppma by the Czochralski method, processing the silicon single crystal ingot into a wafer, and subjecting the wafer to an oxygen precipitation heat treatment so that a residual interstitial oxygen concentration in the wafer should become 8 ppma or less. A silicon wafer produced as described above shows little decrease in resistivity even after a heat treatment in device production etc. Further, if a silicon wafer is produced and heat-treated so that the wafer should have the above-defined initial interstitial oxygen concentration and residual interstitial oxygen concentration, slip dislocations in a subsequent heat treatment process are prevented irrespective of resistivity. Furthermore, by forming an epitaxial layer on a surface of a silicon wafer of the present invention, a high resistivity epitaxial wafer can be produced, which is free from slip dislocations etc. and can be used for various devices.

24 Claims, 4 Drawing Sheets

PRODUCTION METHOD FOR SILICON WAFER AND SILICON WAFER

TECHNICAL FIELD

The present invention relates to a method for producing a silicon wafer of high resistivity and high gettering ability wherein a silicon wafer produced by the Czochralski method is subjected to a heat treatment, and a silicon wafer having such characteristics, as well as a method for producing a silicon wafer wherein generation of slip dislocations, which are likely to be generated in a heat treatment process such as one in a device production process, can be suppressed, and a silicon wafer having such characteristics.

BACKGROUND ART

Silicon wafers of high resistivity produced by the floating zone method (FZ method) have conventionally been used for power devices such as high-voltage power devices and thyristors. However, it is difficult to produce a silicon wafer having a diameter of 200 mm by the FZ method, and it is impossible to produce one having a diameter of 300 mm or more by currently used techniques. Further, the planar resistivity distribution of usual FZ wafers is inferior to that of CZ wafers with respect to both of the macroscopic resistivity distribution and the microscopic resistivity distribution. As a method for improving this situation, there is a method utilizing neutron irradiation. However, this method can produce only N-type wafers, and moreover suffers from a drawback that increased cost is invited.

On the other hand, by the Czochralski method (CZ method), wafers of excellent planar resistivity distribution can be produced. In addition, wafers of a large size having a diameter of 200 mm or 300 mm are already produced by this method, and it is considered to be well possible to produce those having a diameter of about 400 mm or more. Therefore, silicon wafers produced by the CZ method will be promising in the future.

In particular, recent semiconductor devices for mobile communications and the latest C-MOS devices require decrease of parasitic capacity, and for this reason, silicon wafers of a large diameter and high resistivity are required. Further, there has been reported the effect of use of a high resistivity substrate on signal transmission loss or decrease of parasitic capacity in Schottky barrier diodes. Therefore, there is required a method for producing wafers of high resistivity (at least 100 Ω·cm) by the CZ method.

Furthermore, in order to obtain such semiconductor devices as mentioned above with still higher performance, the so-called SOI (Silicon On Insulator) wafers may be used. As a representative method for producing such SOI wafers, there is the wafer bonding method. This method comprises a step of bringing a bond wafer, which serves as a device forming layer, into close contact with a base wafer, which serves as a support substrate, via an oxide film, a step of subjecting them to a heat treatment so that the both should be firmly bonded, and a step of making the bond wafer into a thin film as an SOI layer. As also for the case where semiconductor devices are produced by using bonding SOI wafers produced by such a method, it is required to use wafers of high resistivity produced by the CZ method as base wafers in order to solve the problems such as the production of wafers of a large diameter and the signal transmission loss.

However, since the CZ method utilizes a crucible made of quartz, not a small amount of oxygen (interstitial oxygen) is introduced into a silicon crystal. Although such oxygen atoms are usually electrically neutral when they exist alone by themselves, if they are subjected to a heat treatment at a low temperature of around 350 to 500° C., a plurality of them gather to release electrons and become electrically active oxygen donors. Therefore, if a wafer obtained by the CZ method is subsequently subjected to a heat treatment at about 350 to 500° C. in the device production process and so forth, it may suffer from a problem that resistivity of a high resistivity CZ wafer is reduced due to the formation of the oxygen donors.

One of the methods for preventing the resistivity reduction due to the above oxygen donors and obtaining a silicon wafer of high resistivity is the method for producing a silicon single crystal having a low interstitial oxygen concentration from an initial stage of the crystal growth.

Japanese Patent Publication No. 8-10695 discloses that, as a method for producing a wafer of high resistivity by the CZ method, a silicon single crystal having a high resistivity of 1000 Ω·cm or higher can be produced by preparing a silicon single crystal of a low interstitial oxygen concentration through the magnetic field applied CZ method (the MCZ method). Further, Japanese Patent Laid-open Publication No. 5-58788 discloses that a silicon single crystal can be produced with a high resistivity of 10000 Ω·cm or higher by performing the MCZ method using a synthetic quartz crucible.

As another method for producing wafers of a high resistivity by the CZ method, there has also been proposed a method conversely utilizing the phenomenon of the oxygen donor formation, wherein a P-type silicon wafer of a low impurity concentration and low oxygen concentration is subjected to a heat treatment at 400 to 500° C. to generate oxygen donors, and P-type impurities in the P-type silicon wafer is compensated by these oxygen donors so that the wafer should be converted into N-type to produce an N-type silicon wafer of high resistivity (Japanese Patent Publication No. 8-10695).

However, a silicon single crystal of a low interstitial oxygen concentration produced by the MCZ method or the like as mentioned above suffers from a drawback that the density of bulk defects generated by a heat treatment in the device production process becomes low, and sufficient gettering effect will be unlikely to be obtained. In devices of a high integration degree, it is essential to impart gettering effect by a certain amount of oxygen precipitation.

Further, the method of obtaining a silicon wafer of high resistivity by generating oxygen donors by a heat treatment and compensating P-type impurities in the wafer to convert it into N-type is a complicated method that requires accurate control of initial resistivity (concentration and kind of impurities) and heat treatment time, and a heat treatment for a long period of time. Moreover, this method cannot provide P-type silicon wafers of high resistivity. In addition, resistivity of wafers obtained by this method may also vary depending on a subsequent heat treatment. Furthermore, in this method, if a high interstitial oxygen concentration is used, it becomes difficult to control the wafer resistivity. Therefore, this method suffers from a drawback that a low initial concentration of interstitial oxygen in a silicon wafer must be used, and the gettering effect of the wafer becomes low.

While semiconductor devices for mobile communications or the latest C-MOS devices require silicon wafers of a large diameter and high resistivity produced by the CZ method as described above, integrated circuits such as usual LSI are also produced with silicon wafers mainly produced by the CZ method and having a usual resistivity (about 1–20 Ω·cm) and through a production process comprising a large number of production steps including several heat treatment steps other than the aforementioned heat treatment of the device production process. These heat treatment steps are very important steps, in which performed are, for example, formation of an oxide film on a wafer surface layer, diffusion of impurities, formation of denuded zone and gettering layer and so forth.

As a resistance heating type heat treatment furnace for a so-called batch processing, which is used for the aforementioned heat treatment process and can simultaneously anneal a plurality of wafers, there are a horizontal type furnace and a vertical type furnace. In the horizontal type furnace, wafers are loaded into the furnace while they are vertically held on a jig for holding wafers, called a boat, and subjected to a heat treatment. In the vertical type furnace, wafers are loaded into the furnace while they are horizontally held on a boat, and subjected to a heat treatment.

As one of problems observed in heat treatments of the aforementioned both types, generation of slip dislocation is mentioned. Slip dislocations are defects caused by deformation of crystals due to slippage of the crystal caused by thermal stress in the heat treatment process, which forms steps on wafer surfaces. If such slip dislocations are generated on the wafer surfaces, not only the mechanical strength of the wafers is degraded, but also the device characteristics are adversely affected, for example, junction leakage is caused. Therefore, it is desirable that they should be reduced as far as possible.

If a heat treatment is carried out by using a heat treatment furnace of the aforementioned batch processing type, temperature distribution will be generated within a wafer plane during loading and unloading of wafers into or from the heat treatment furnace and temperature increase or decrease in the furnace. This temperature distribution generates stress. Then, when this stress exceeds a certain critical value, slip dislocations are generated. In this case, since wafers are placed on a boat, the weight of the wafers is likely to be concentrated at a portion where they are in contact with the boat. Therefore, the stress applied to the contact portion becomes large, and slip dislocations become likely to be generated. In particular, if the diameter of wafers becomes large, the weight of wafers becomes large and therefore its influence becomes serious.

On the other hand, other than the aforementioned heat treatment furnace of batch processing type, an RTA (Rapid Thermal Annealing) apparatus, which is a heat treatment furnace of single wafer processing type and utilizes lamp heating or the like, may be used for the heat treatment process. An apparatus of this type performs single wafer process, shows extremely high temperature increasing and decreasing rates, and is unlikely to cause temperature distribution within a wafer plane compared with a batch type furnace. Therefore, it is particularly effective for heat treatment of wafers of a large diameter. However, like a batch type heat treatment furnace, an apparatus of this type also suffers from the phenomenon that stress due to the weight of wafers is concentrated on the contacting portion with the jig for holding the wafers, and thus slip dislocations are likely to be generated.

In order to suppress the generation of such slip dislocations, improvement has been attempted so far mainly from two kinds of aspects. One of them is an attempt to reduce the stress applied on the contacting portion of wafers and boat, in which it is attempted to suppress the concentration of the stress by improving a shape of the boat. For example, in the technique disclosed in Japanese Patent Laid-open Publication No. 9-251961, the concentration of the stress is obviated by using plane contact, not point contact, between the wafers and the boat, which plane contact is obtained by using a vertical type heat treatment boat having an angle of a portion for holding the wafer corresponding to deflection of the wafers caused by the weight of the wafers.

Another aspect consists of reduction of the temperature distribution within the wafer plane generated during the heat treatment process, and the reduction is realized by improvement of the heat treatment conditions. For example, in the technique disclosed in Japanese Patent Laid-open Publication No. 7-235507, hydrogen or helium, which has higher thermal conductivity compared with nitrogen and argon usually used for temperature increase and decrease, is used to activate the conduction of heat into the wafers so that temperature difference within a wafer plane should be reduced. Further, Japanese Patent Laid-open Publication No. 7-312351 proposed prevention of the generation of slip dislocations by lowering temperature increasing and decreasing rates as the temperature becomes higher.

As approaches based on these two kinds of aspects, there are known a number of techniques other than those exemplified above. Although these approaches are effective in some degree concerning prevention of slip dislocations during the heat treatment process, they cannot necessarily be considered sufficient means for all of the various heat treatment processes used in the device production process, and some may have difficulty concerning the cost for practical use.

Other than the aforementioned two kinds of approaches for suppressing the generation of slip dislocations, it has also been attempted to improve the anti-slip property from the viewpoint of oxide precipitates in wafers. For example, Japanese Patent Laid-open Publication No. 9-190954 describes that, as for CZ wafers of low oxygen concentration, the generation of slip dislocations can be suppressed if polyhedral oxide precipitates are formed at a predetermined density within a region covering a distance of 10 mm or less from the periphery of wafer, in which slip dislocations are likely to be generated. Furthermore, it disclosed a technique comprising implanting oxygen ions into the region covering a distance of 10 mm or less from the periphery and subjecting the wafer to a two-step heat treatment in a nitrogen atmosphere in order to generate oxide precipitates at a predetermined density.

Further, from the viewpoint of the problem that slip dislocations are generated from oxide precipitates themselves when thermal compressive stress is applied to a wafer containing the oxide precipitates, Japanese Patent Laid-open Publication No. 10-150048 proposed a wafer containing carbon at a predetermined concentration as a wafer in which slip dislocations are unlikely to be generated even under a thermal compressive stress with which slip dislocations may be normally generated.

As explained above, the conventional techniques suffer from a problem that, when a silicon wafer produced by the CZ method (it may be referred to simply as a "CZ silicon wafer" or "CZ wafer" for the present invention) is subjected to a heat treatment during the device production process, for example, for formation of oxide film, diffusion of impurities, formation of denuded zone or gettering layer and so forth, the characteristics of wafers may be adversely affected (reduction in resistivity, generation of slip dislocations etc.).

That is, among the conventional techniques, there are no means for obtaining a CZ wafer of high resistivity that does not suffer from the problem of reduction in resistivity due to the generation of oxygen donors and shows high gettering effect, even when the silicon wafer produced by the Czochralski method is subjected to a heat treatment. Thus, it has been desired to develop a method satisfying these requirements.

Further, as for suppression of slip dislocations during the heat treatment process, the techniques disclosed in the above Japanese Patent Laid-open Publication Nos. 9-190954 and 10-150048 are techniques for improving characteristics of wafers themselves, and therefore they may be effective for any heat treatment process. However, both of them are not practical techniques. That is, the technique of Japanese Patent Laid-open Publication No. 9-190954 requires additional steps of ion implantation and the two-step heat treatment. Further, in the technique of Japanese Patent Laid-open Publication No. 10-150048, since carbon is added at a predetermined concentration, there is anxiety for adverse effect of carbon on the device characteristics.

Furthermore, there is also a problem that, when an epitaxial wafer is produced by depositing a single crystal silicon layer on a silicon wafer through epitaxial growth, defects such as slip dislocations are generated during the epitaxial process at a high temperature, thereby the yield of the epitaxial process is degraded and the characteristics of devices eventually produced are also degraded.

DISCLOSURE OF THE INVENTION

The present invention was accomplished in view of such problems, and its first object is to provide a method for obtaining a CZ wafer exhibiting high resistivity and high gettering effect while preventing the reduction of resistivity due to the generation of oxygen donors, a CZ wafer of high resistivity produced by the method, and an SOI wafer using this wafer.

The second object of the present invention is to provide a CZ silicon wafer in which the anti-slip property of a portion to be contact with a heat treatment boat of the silicon wafer to be subjected to a heat treatment process is improved and there are substantially no slip generated from oxide precipitates themselves through a relatively simple practical method.

A further object of the present invention is to provide an epitaxial wafer in which slip dislocations are not generated and high resistivity and gettering effect are attained.

In order to achieve the aforementioned first object, the present invention provides a method for producing a silicon wafer, which comprises growing a silicon single crystal ingot having a resistivity of 100 $\Omega \cdot cm$ or more and an initial interstitial oxygen concentration of 10 to 25 ppma by the Czochralski method, processing the silicon single crystal ingot into a wafer, and subjecting the wafer to an oxygen precipitation heat treatment so that a residual interstitial oxygen concentration in the wafer should become 8 ppma or less.

If a silicon wafer of high oxygen concentration having a high resistivity of 100 $\Omega \cdot cm$ or more and an initial interstitial oxygen concentration of 10 to 25 ppma (JEIDA: Japan Electronic Industry Development Association) is produced by the Czochralski method, and this high resistivity CZ wafer is subjected to an oxygen precipitation heat treatment so that a residual interstitial oxygen concentration in the wafer should become a low oxygen concentration of 8 ppma or less, as described above, interstitial oxygen in the silicon wafer can be precipitated to prevent them from becoming electrically active oxygen donors, and thereby the reduction of resistivity of the wafer can be prevented. In addition, this method provides a high density of oxide precipitates, and therefore the gettering effect can also be enhanced. Moreover, in this method, since the silicon wafer is produced by the CZ method, the diameter of the wafer can easily be made larger.

The present invention further provides a silicon wafer produced by the aforementioned production method. A silicon wafer produced as described above is a silicon wafer which is produced by subjecting a silicon wafer having a resistivity of 100 $\Omega \cdot cm$ or more and an initial interstitial oxygen concentration of 10 to 25 ppma to an oxygen precipitation heat treatment and has a residual interstitial oxygen concentration of 8 ppma or less.

In the silicon wafer of the present invention, the amount of residual interstitial oxygen, which becomes electrically active oxygen donors, is small as described above, but there are sufficient oxide precipitates in the bulk portion. Therefore, it can be a silicon wafer having both of high resistivity and gettering effect.

The silicon wafer of the present invention further can be a silicon wafer having a resistivity of 100 $\Omega \cdot cm$ or more and an initial interstitial oxygen concentration of 10 to 25 ppma, and maintaining resistivity of 100 $\Omega \cdot cm$ or more after a device production heat treatment at 350 to 500° C.

Thus, this silicon wafer of the present invention is a wafer of which resistivity is maintained to be 100 $\Omega \cdot cm$ or more after the wafer is subjected to a heat treatment for device production at 350 to 500° C., because the generation of oxygen donors is suppressed, in spite of the fact that it has a high resistivity of 100 $\Omega \cdot cm$ or more and a high oxygen concentration of 10 to 25 ppma as the initial interstitial oxygen concentration. That is, the wafer can be a silicon wafer having both of high resistivity and high gettering effect.

The term "device production heat treatment" is used herein to collectively refer heat treatments used in the device production process such as electrode wiring process, after the wafer is subjected to a gettering heat treatment and other treatments.

Further, the aforementioned silicon wafers of the present invention can be a silicon wafer having a bulk defect density of $1 \times 10^8$ to $2 \times 10^{10}$ defects/cm$^3$ after a gettering heat treatment or a device production heat treatment.

The above silicon wafer having a bulk defect density of $1 \times 10^8$ to $2 \times 10^{10}$ defects/cm$^3$ after a gettering heat treatment or a device production heat treatment can be a silicon wafer having nuclei that can be origins of oxide precipitates in the wafer, that is, oxygen precipitation nuclei, at a level considered necessary as gettering sites, i.e., a density of oxide precipitates as bulk defects of $1 \times 10^8$ to $2 \times 10^{10}$ defects/cm$^3$, in spite of the fact that it is a high resistivity wafer, and thus it is a silicon wafer that does not exist so far.

The term "gettering heat treatment" is used herein to collectively refer to heat treatments used after the processing of the grown silicon single crystal ingot into a wafer and before the device process, and they mainly aim at elimination of crystal defects present in a portion near a surface by out-diffusion of impurity oxygen.

The present invention also provides a silicon wafer having a resistivity of 100 $\Omega \cdot cm$ or more, an interstitial oxygen concentration of 8 ppma or less and a bulk defect density of $1 \times 10^8$ to $2 \times 10^{10}$ defects/cm$^3$.

Such a silicon wafer having a high resistivity of 100 $\Omega \cdot cm$ or more, an interstitial oxygen concentration of 8 ppma or less and a bulk defect density of $1\times10^8$ to $2\times10^{10}$ defects/$cm^3$ as mentioned above can be a silicon wafer in which high resistivity is maintained even after the wafer is subjected to a low temperature heat treatment at 350 to 500° C. such as a device heat treatment, and which has sufficient gettering effect.

The present invention also provides a bonded SOI wafer which utilizes the high resistivity CZ silicon wafer of the present invention as a base wafer.

Such a bonded SOI wafer which utilizes the CZ silicon wafer of the present invention as a base wafer is an SOI wafer in which high resistivity is maintained even after a device production heat treatment, and which has gettering effect. Therefore, it can be made with a larger diameter, and it can reduce the signal transmission loss and so forth. Thus, it is especially useful for high-frequency devices.

The oxygen precipitation heat treatment to which the base wafer for the bonded SOI wafer is subjected can also serve as a bonding heat treatment used in the production process of the bonded SOI wafer.

That is, in the production of the bonded SOI wafer comprising a step of bringing a bond wafer into close contact with a base wafer via an oxide film, a step of subjecting them to a bonding heat treatment so that the both should be firmly bonded, and a step of making the bond wafer into a thin film as an SOI layer, if a silicon wafer having a resistivity of 100 $\Omega$·cm or more and an initial interstitial oxygen concentration of 10 to 25 ppma is used as the base wafer, and such a heat treatment that can provides a residual interstitial oxygen concentration in the base wafer of 8 ppma or less is performed as the bonding heat treatment, an SOI wafer having both of high resistivity and sufficient gettering effect can be produced more efficiently.

In this case, the base wafer to be used may be a wafer subjected to at least a part of the oxygen precipitation heat treatment before the step of bringing the bond wafer into close contact with the base wafer.

When a multi-step heat treatment is performed as the oxygen precipitation heat treatment performed during the production process of a bonded SOI wafer, a part of the oxygen precipitation heat treatment can be performed beforehand for a base wafer before it is brought into close contact with a bond wafer, and the remaining heat treatment can be performed as the bonding heat treatment. If the oxygen precipitation heat treatment required for the production process of a bonded SOI wafer is performed as divided heat treatments, the bonding heat treatment process can be shortened compared with the case where it is attained only by the bonding heat treatment. Therefore, the time control of each step becomes easy, thus stock between process steps can be reduced, and products can be produced efficiently.

Furthermore, in the above case, at least a part of the oxygen precipitation heat treatment performed for the base wafer can also be performed before the final polishing of the base wafer.

While at least a part of the oxygen precipitation heat treatment performed for a base wafer before the step of bringing the base wafer into close contact with the bond wafer may be performed after the base wafer is mirror-polished, it is preferably performed before the final polishing of the polishing process. If at least a part of the oxygen precipitation heat treatment before the close contacting step is performed before the final polishing as described above, degradation of microroughness, haze or the like of a surface of the wafer possibly caused by the heat treatment process can be improved by the final polishing, and thus occurring frequency of bonding defect (void) can be suppressed.

Furthermore, in order to achieve the aforementioned second object, the present invention provides a method for producing a silicon wafer, which comprises growing a silicon single crystal ingot having an initial interstitial oxygen concentration of 10 to 25 ppma by the Czochralski method, processing the silicon single crystal ingot into a wafer, and subjecting the wafer to an oxygen precipitation heat treatment so that a residual interstitial oxygen concentration in the wafer should become 8 ppma or less. In this method, it is preferable to perform the oxygen precipitation heat treatment so that a residual interstitial oxygen concentration in the wafer should become 6 ppma or less.

By subjecting a CZ wafer obtained from a silicon single crystal ingot having an initial interstitial oxygen concentration of 10 to 25 ppma to an oxygen precipitation heat treatment so that a residual interstitial oxygen concentration in the wafer should become 8 ppma or less, preferably 6 ppma or less as described above, oxide precipitates and residual interstitial oxygen necessary for suppressing slip dislocations can be formed in the bulk portion of the wafer.

Further, by producing a silicon wafer as described above, the anti-slip property of a portion to be contact with a heat treatment boat in a CZ wafer to be subjected to the subsequent heat treatment is improved, and a silicon wafer containing substantially no slip generated from oxide precipitates themselves can be produced through a relatively simple and practical method.

Furthermore, in the aforementioned method, the oxygen precipitation heat treatment is preferably carried out by performing a high temperature heat treatment at 1100° C. or higher in the first step to out-diffuse the interstitial oxygen in the surface of the wafer, so that a DZ layer (Denuded Zone) should be formed in the wafer surface.

By performing such an oxygen precipitation heat treatment, there can be obtained a wafer in which slip dislocations hardly occur and which has superior gettering characteristic, and moreover oxide precipitates in the wafer surface are reduced. Therefore, when devices are formed on the surface, the possibility of adverse effect on the device characteristics is substantially eliminated.

Further, also in a case where an epitaxial layer is formed on the surface of the wafer produced according to the present invention, it is preferable to perform a heat treatment so that a DZ layer should be formed as described above, since there is little possibility that crystallinity of the epitaxial layer is degraded if a DZ layer is formed on the wafer surface.

Furthermore, according to the present invention, when a silicon wafer is produced by performing the oxygen precipitation heat treatment, the oxygen precipitation heat treatment for the silicon wafer is preferably performed before the final polishing of the wafer.

The oxygen precipitation heat treatment of the present invention may be performed for a mirror-polished wafer. However, if it is performed for a wafer having a chemically etched surface (CW) before it is subjected to the mirror polishing, or a wafer before it is subjected to a final polishing of the wafer, which is usually comprises multiple steps (for example, primary polishing, secondary polishing and polishing for finishing (final polishing)), there can be obtained an advantage that possible degradation of surface conditions of the wafer in the oxygen precipitation heat treatment process can be improved in the subsequent polishing.

The present invention further provides a silicon wafer produced by the aforementioned production method. A silicon wafer produced as described above is a silicon wafer that shows superior anti-slip property and gettering characteristic, and produces extremely few slip dislocations or defects during a heat treatment process in the device production and the like.

Further, since it shows high anti-slip property, slip can be suppressed without lowering the conventional process temperature. Therefore, the applicable range of the device process is broadened, and extremely useful silicon wafers can be provided.

The present invention also provides a silicon wafer having an interstitial oxygen concentration of 8 ppma or less and an oxide precipitate density of $1 \times 10^8$ to $2 \times 10^{10}$ precipitates/$cm^3$ in the wafer. The interstitial oxygen concentration is preferably 6 ppma or less, and to put it concretely, the oxide precipitates in the silicon wafer are polyhedrons having a size of 200 nm or more or plates having a size of 230 nm or more.

This wafer can also suppress the generation of slip dislocations during the gettering heat treatment at a high temperature or device production heat treatment to be performed subsequently, and there can be obtained a wafer exhibiting superior gettering characteristic and extremely suitable for the production of LSI and so forth.

The present invention also provides an epitaxial wafer comprising an epitaxial layer formed on the surface of the aforementioned silicon wafer.

An epitaxial wafer in which an epitaxial layer is formed on the silicon wafer of the present invention can be an epitaxial wafer that is not hitherto known, in which the generation of slip dislocations in the epitaxial step is suppressed, and which has also high resistivity and gettering effect. Therefore, the application thereof is broadened over various devices.

As explained above, according to the present invention, a CZ silicon wafer having a resistivity of 100 Ω·cm or more is subjected to the oxygen precipitation heat treatment so that the residual interstitial oxygen concentration should become 8 ppma or less, and this enables preventing the reduction of resistivity due to the generation of oxygen donors occurring during a heat treatment in the device production process, in particular, a device production heat treatment at 350 to 500° C. performed in the electrode wiring process and so forth and providing a high resistivity CZ wafer also exhibiting high gettering effect. In addition, this wafer can be used as it is, but also as a base wafer of a bonded SOI wafer, and it can be easily produced with a larger diameter. Moreover, wafers showing little signal transmission loss and so forth can be produced with high productivity.

Furthermore, according to the present invention, a CZ silicon wafer is subjected to the oxygen precipitation heat treatment so that the residual interstitial oxygen concentration should become 8 ppma or less, thereby the anti-slip property of a portion to be in contact with a heat treatment boat in a CZ silicon wafer to be subjected to the subsequent heat treatment is improved, and a silicon wafer containing substantially no slip generated from oxide precipitates themselves can be produced through a relatively simple and practical method.

Therefore, by using such a wafer, slip can be sufficiently suppressed, even if the wafer is a wafer having a large diameter of 200 mm, 300 mm or more, which is likely to suffer from the generation of slip dislocation. In addition, since the wafer exhibits high anti-slip property, slip can be suppressed without lowering the conventional process temperature. Therefore, the applicable range of the device process is broadened, and extremely useful silicon wafers can be provided.

BEST MODE FOR CARRYING OUT THE INVENTION

Hereafter, the present invention will be explained in more detail.

The inventors of the present invention found a method of reducing the residual interstitial oxygen concentration of a high resistivity CZ wafer by subjecting the wafer to an oxygen precipitation heat treatment as a method for obtaining a silicon wafer of which resistivity is not changed by a subsequent heat treatment, and which exhibits high gettering effect. Then, they defined various conditions for practically utilizing this finding, and thus achieved the first object of the present invention.

The conventional methods for obtaining high resistivity CZ silicon wafers must inevitably use a low interstitial oxygen concentration during the silicon single crystal growth, and therefore the gettering effect of high resistivity CZ silicon wafers obtained by the conventional methods becomes low.

Therefore, the inventors of the present invention conceived a method wherein the initial interstitial oxygen concentration is not suppressed to a low level during the growth of a silicon single crystal, but a high resistivity single crystal having a usual interstitial oxygen concentration is grown during the growth of a single crystal and processed into wafers, and interstitial oxygen is intentionally precipitated by a subsequent heat treatment to reduce active oxygen in the silicon wafer, thereby preventing oxygen from acting as a donor.

Then, the inventors of the present invention conducted investigation through experiments about the relationship between the change in resistivity of a silicon wafer and the residual interstitial oxygen concentration of the silicon wafer when the wafer was subjected to a device production heat treatment.

The inventors of the present invention first subjected high resistivity CZ wafers having an initial interstitial oxygen concentration of 10 to 25 ppma and a resistivity of 100 Ω·cm or more to various heat treatments for precipitating interstitial oxygen. Thereafter, the residual interstitial oxygen concentration of the wafers after they were subjected to the oxygen precipitation heat treatment was measured. Then, after the resistivity of the silicon wafers were measured, wafers were subjected to a heat treatment at 450° C. for 16 hours as a device production heat treatment, and the resistivity of the wafers was measured again. Finally, the change in the resistivity and the residual interstitial oxygen concentration before and after the device production heat treatment were compared to examine the relationship between them.

Figure 1:
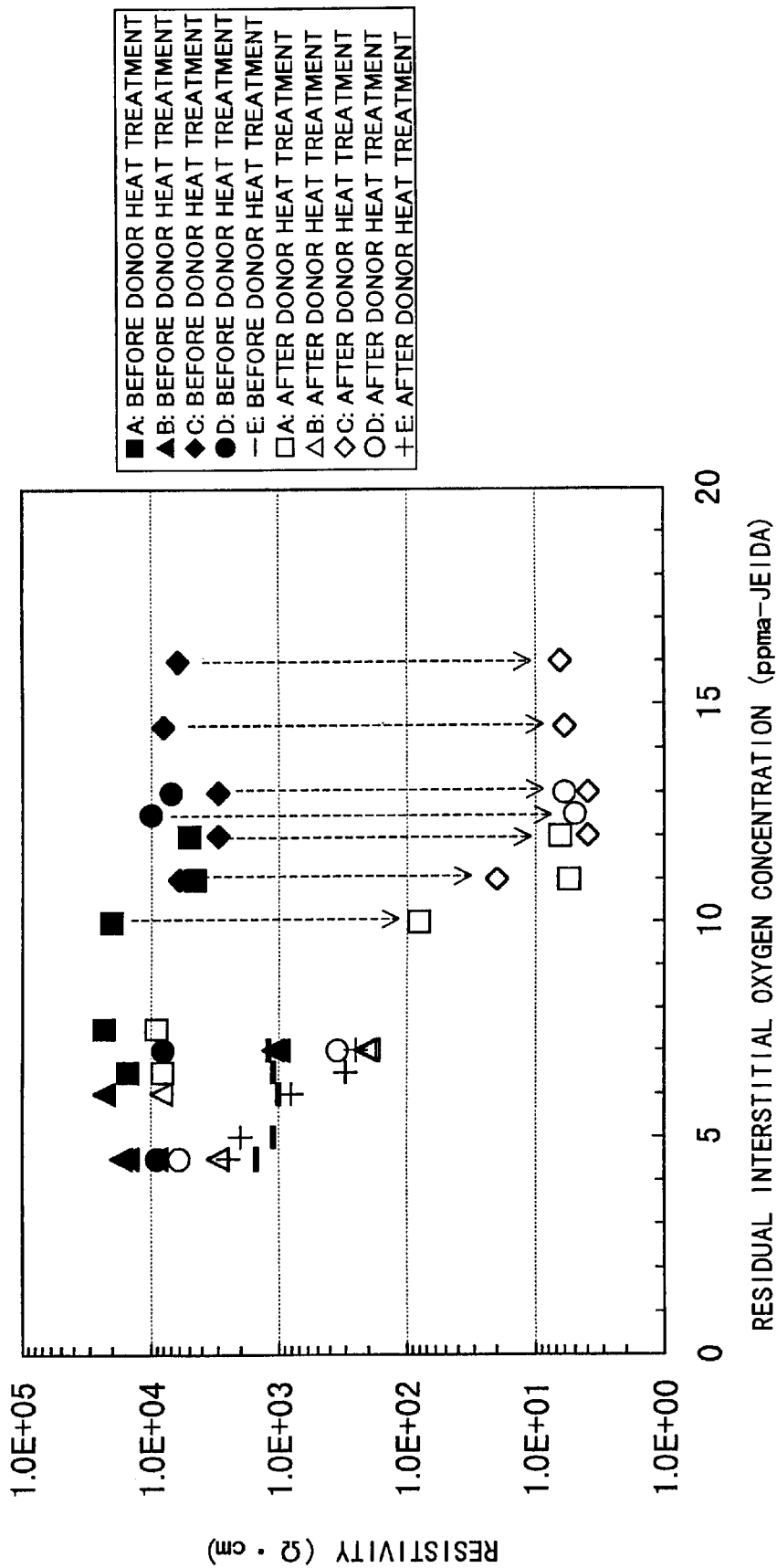
FIG. 1 is a view showing relationship between the residual interstitial oxygen concentration and the resistivity of a silicon wafer.

FIG. 1 shows the results of the above experiment. The plots in the figure with squares, triangles and so forth represent the results obtained for wafers subjected to oxygen precipitation heat treatments with different heat treatment conditions. Among the plots with various symbols, the plots with black symbols represent resistivity before the device production heat treatment, and the plots with white symbols represent resistivity after the device production heat treatment.

As shown in FIG. 1, if the residual interstitial oxygen concentration was about 8 ppma (JEIDA) or lower, the change in the resistivity after the device production heat treatment was very small irrespective of the initial interstitial oxygen concentration and the heat treatment conditions of the oxygen precipitation heat treatment.

That is, even for a wafer produced from a single crystal of a high initial interstitial oxygen concentration of 10 to 25 ppma at the time of silicon single crystal growth, it is possible to prevent the reduction in resistivity due to the device production heat treatment by subjecting the wafer to an oxygen precipitation heat treatment so that the residual interstitial oxygen concentration should become about 8 ppma or less regardless of the heat treatment conditions of the oxygen precipitation heat treatment.

However, an actually used silicon wafer is required to maintain the high resistivity and have gettering effect at the same time. Since it is necessary to form oxide precipitates in order to impart the gettering effect, the initial interstitial oxygen concentration before the oxygen precipitation heat treatment must be at least about 10 ppma. However, if it exceeds 25 ppma to the contrary, the precipitation becomes excessive, and thereby the wafer strength may be degraded. Therefore, it is suitably 25 ppma or less.

Furthermore, a wafer subjected to the oxygen precipitation heat treatment according to the present invention can have a density of $1 \times 10^8$ to $2 \times 10^{10}$ defects/cm$^3$ for bulk defects to be gettering sites after the gettering heat treatment or the device production heat treatment, since a large amount of the interstitial oxygen has precipitated as fine oxide precipitates, and thus it can be a wafer having sufficient gettering effect.

Further, when a bonded SOI wafer is produced by using such a wafer, the aforementioned high resistivity CZ wafer can be used at least as a base wafer. A silicon oxide film can be formed on a surface of at least one of a bond wafer to be a device layer and a base wafer, and then the both can be adhered to each other. After the adhered wafers are subjected to a bonding heat treatment to enhance the bonding strength, the bond wafer can be made into a thin film as an SOI layer. Thus, an SOI wafer can be obtained, which enables production of devices excellent in high-frequency characteristics, since the base wafer can maintain the high resistivity even if it is subjected to the device production heat treatment and so forth.

If it is simply intended to use a high resistivity wafer as a base wafer, a FZ wafer, an insulating substrate or the like can be used. However, by using a CZ wafer, it becomes relatively easy to use a larger diameter exceeding 8 inches. In addition, since a proper amount of oxygen is contained in the wafer, mechanical strength of the wafer becomes strong against a heat treatment. Moreover, the wafer would have gettering effect for contaminants such as heavy metals, since oxide precipitates can be formed in the bulk portion.

Since such a wafer as mentioned above does not show change in resistivity due to the influence of oxygen donors and high resistivity is maintained even when it is subjected to a heat treatment at about 350 to 500° C. during the device production process and so forth. In addition, it has the gettering effect, since oxide precipitates are formed in the bulk portion. Therefore, it can be considered an extremely promising material for semiconductor devices for mobile communications and the latest C-MOS devices.

The inventors of the present invention further studied the CZ wafer of the present invention from different angles in order to understand the characteristics on the wafer, and obtained the following novel findings. Thus, the second object was achieved.

That is, since the wafer of the present invention contains a considerable amount of oxide precipitates in the bulk portion, it was considered as a matter of course that it is likely to suffer from generation of slip dislocations when it was subjected to a heat treatment used for the device process or the like. Contrary to this expectation, however, slip dislocations were not observed in the wafer by X-ray topography even after it was subjected to a heat treatment that was considered to surely generate slip dislocations in usual wafers. Furthermore, this phenomenon that slip dislocations were not generated could be confirmed not only for a wafer having a resistivity of 100 Ω·cm or more, but also for a wafer having a resistivity of less than 100 Ω·cm.

By the way, as for the shape and size of oxide precipitates and generation of slip dislocations, the aforementioned Japanese Patent Laid-open Publication No. 10-150048 describes a finding that, when the size of polyhedral precipitates or plate-like precipitates reaches about 200 nm or more or 230 nm or more, respectively, slip dislocations become likely to be generated. When the oxide precipitates of the present invention were observed by a transmission electron microscope, they had a polyhedral shape or plate-like shape. To determine their size, substantially the same portion as Japanese Patent Laid-open Publication No. 10-150048 was measured (a length of one side in four sides of a rectangle of an octahedral structure for polyhedral precipitates, or a length of a diagonal line of precipitates for plate-like precipitates). Most of the polyhedral precipitates had the length of 200 nm or more, and most of the plate-like precipitates had the length of 230 nm or more.

The reason is currently unknown why slip dislocations are not generated in the wafer of the present invention as described above in spite of the conditions that likely to generate slip dislocations in view of the shape and size of conventional oxide precipitates or heat treatment conditions. However, it is considered that the residual interstitial oxygen concentration, and the size and density of oxide precipitates are involved.

That is, it is considered that, if oxide precipitates are formed beforehand with a certain density and size before a wafer is subjected to a process heat treatment (gettering heat treatment, device production heat treatment etc.) like the wafer of the present invention, oxide precipitates become unlikely to regrow and thus slip dislocations are not generated even if it is subjected to a process heat treatment, because of the fact that the residual interstitial oxygen concentration is low and the like.

The inventors of the present invention further continued their studies, and found that the silicon wafer and the SOI wafer of the present invention can be efficiently produced by subjecting the silicon wafer to the oxygen precipitation heat treatment before the final polishing of the wafer. That is, even if the surface conditions (microroughness, haze etc.) of the wafer are degraded by the oxygen precipitation heat treatment, it can be made into a good mirror surface wafer by subsequent polishing. Therefore, by subjecting a silicon wafer or a base wafer to the oxygen precipitation heat treatment at least before the final polishing, the silicon wafer and the SOI wafer of the present invention can be obtained without further increasing the polishing steps.

Further, since the silicon wafer of the present invention scarcely suffers from the generation of slip dislocations during a heat treatment as described above, and moreover oxide precipitates with a sufficient size and density are formed in the bulk portion, the oxide precipitates do not disappear even if epitaxial growth is performed at a high temperature of about 1100–1200° C. on the surface. Therefore, it was also found by the inventors of the present invention that an epitaxial wafer that has not existed so far can be obtained, which does not suffer from generation of slip dislocations during the epitaxial process, moreover, which has both high resistivity and gettering effect, and therefore the application of such a wafer is broadened over various devices.

As a heat treatment furnace that can be used for performing the oxygen precipitation heat treatment in any of the aforementioned production methods of the present invention, there can be mentioned a generally used heater heating type heat treatment furnace capable of batch processing of 100 or more wafers (also referred to as "batch furnace" hereinafter) or the aforementioned RTA apparatus characterized by rapid heating and rapid cooling by lamp heating and based on single wafer processing, of which development has recently been progressed.

Further, the precipitation heat treatment method is not particularly limited so long as oxide precipitates are eventually formed and the residual interstitial oxygen concentration should become 8 ppma or less. For example, it may be one using only one heat treatment or a multi-step heat treatment, and the batch furnace and the RTA apparatus may be used in combination.

Hereafter, embodiments of the present invention will be explained more specifically. However, the present invention is not limited to these.

First, a silicon single crystal ingot is pulled by the known CZ method or the known MCZ method where a single crystal is pulled while a magnetic field is applied to a melt in the CZ method to control convection of the silicon melt, so that the silicon single crystal ingot should have a desired resistivity and an initial interstitial oxygen concentration of 10 to 25 ppma. These pulling methods are methods comprising bringing a seed crystal into contact with a melt of polycrystalline silicon raw material contained in a quartz crucible and slowly pulling the seed crystal with rotation to allow growth of a single crystal ingot of a desired diameter. A desired initial interstitial oxygen concentration can be obtained by using conventional techniques. For example, a crystal having a desired oxygen concentration can be obtained by suitably adjusting parameters such as rotation number of the crucible, flow rate of introduced gas, atmospheric pressure, temperature distribution and convection of silicon melt and strength of the magnetic field to be applied.

The CZ silicon single crystal ingot obtained as described above is sliced by using a cutting machine such as a wire saw or inner diameter slicer, and subjected to steps of chamfering, lapping, etching, polishing and so forth to be processed into CZ silicon single crystal wafers according to conventional techniques. Of course, these steps are mere examples, and there may be used various other steps such as cleaning step and heat treatment step. Further, the steps are used with suitable modification including the alteration of the order of steps, omission of some steps and so forth according to purpose.

Then, the CZ silicon single crystal wafer is subjected to such an oxygen precipitation heat treatment that the residual interstitial oxygen concentration of the wafer should become 8 ppma or less. The oxygen precipitation heat treatment that provides a residual interstitial oxygen concentration of 8 ppma or less used here cannot necessarily be defined, since it may vary depending on the initial interstitial oxygen concentration of the wafer and thermal history during the crystal growth. However, it can be empirically decided depending on the conditions such as these initial interstitial oxygen concentration and thermal history.

Examples of the RTA apparatus used for the oxygen precipitation heat treatment of the present invention include apparatuses such as lamp heaters based on heat radiation. As an example of commercially available apparatuses, Model SHS-2800 produced by Steag Microtec International can be mentioned. These apparatuses are not particularly complicated, and are not expensive either. As for the batch furnace, α-8 produced by Tokyo Electron Ltd. can be mentioned.

Figure 4:
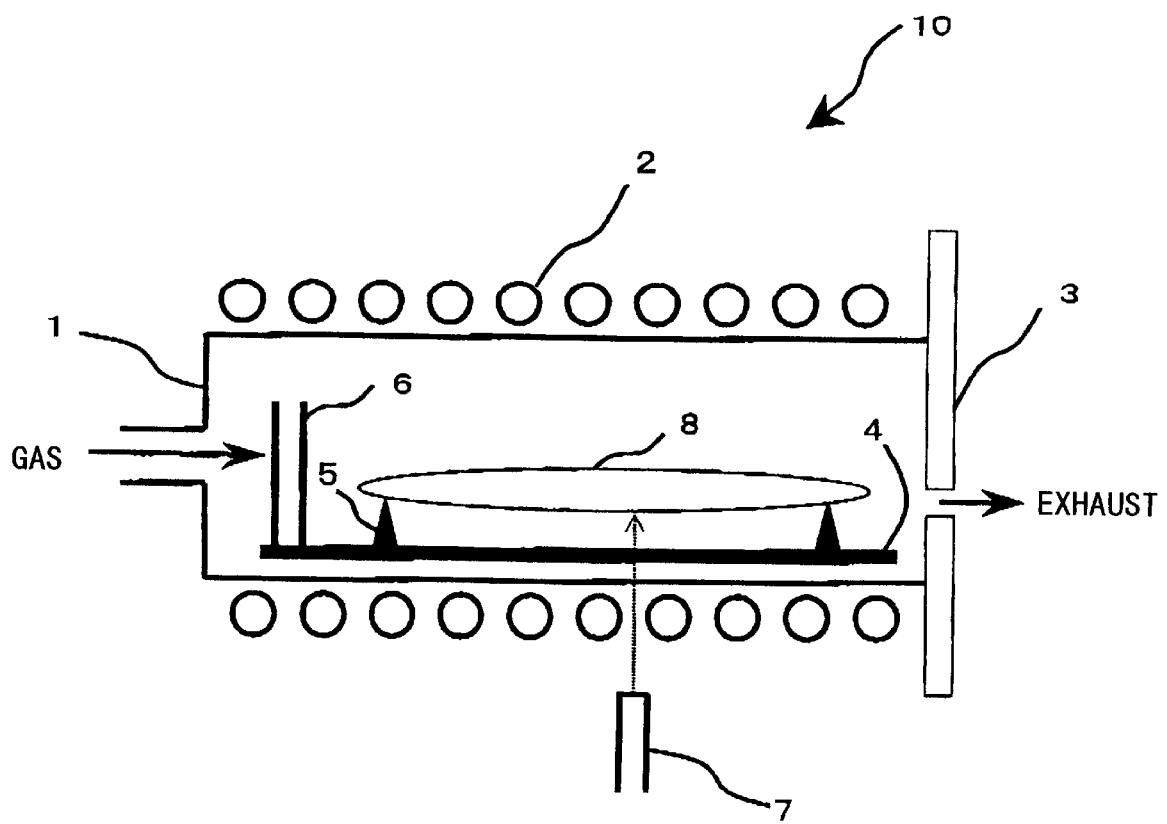
FIG. 4 is a schematic sectional view showing an apparatus capable of rapidly heating and rapidly cooling a silicon wafer.

Now, an example of the rapid heating and rapid cooling apparatus (RTA apparatus) for silicon single crystal wafers used in the present invention will be explained. FIG. 4 is a schematic view of the RTA apparatus.

The heat treatment apparatus 10 shown in FIG. 4 has a chamber 1 consisting of quartz, and a wafer is heat-treated within this chamber 1. Heating is achieved by heating lamps 2, which are disposed under and over the chamber and at left and right of the chamber so that they should surround the chamber 1. Electric power supplied to these lamps can be independently controlled.

As for the gas supplying side, a non-illustrated oxygen gas feed source and nitrogen gas feed source are connected, so that these gases can be mixed in an arbitrary ratio and supplied into the chamber 1.

An auto shutter 3 is provided at the gas exhausting side, and it shuts the inside of the chamber 1 off from the outer air. The auto shutter 3 has a wafer loading port not shown in the figure, which can be opened and closed by a gate valve. The auto shutter 3 is also provided with a gas exhausting outlet, so that the atmospheric pressure in the furnace can be controlled.

The wafer 8 is placed on a three-point supporting part 5 formed on a quartz tray 4. A buffer 6 made of quartz is provided at the gas inlet side of the tray 4, so that it can prevent the wafer 8 from being directly blown by the introduced gas flow.

Further, the chamber 1 is provided with a special window for temperature measurement, which is not shown in the figure, and the temperature of the wafer 8 can be measured by a pyrometer 7 installed in the outside of the chamber 1 through the special window.

By using the heat treatment apparatus 10 mentioned above, the heat treatment for rapid heating and rapid cooling of a wafer is performed as follows.

First, the wafer 8 is loaded into the chamber 1 from the loading port and placed on the tray 4 by a wafer handling apparatus not shown in the figure. Then, the auto shutter 3 is closed, and the inside of the chamber 1 is filled with a predetermined atmosphere.

Subsequently, electric power is supplied to the heating lamps 2 to heat the wafer 8 to a predetermined temperature, for example, 1100° C. to 1300° C. In this operation, it takes, for example, about 20 seconds to attain the desired temperature. Then, the wafer 8 is maintained at the temperature for a predetermined period of time, and thus the wafer 8 can be subjected to a high temperature heat treatment. When the predetermined time has passed and the high temperature heat treatment is finished, output of the lamps 2 is reduced to lower the temperature of the wafer 8. This temperature decrease can be also performed within about 20 seconds. Finally, the wafer 8 is unloaded by the wafer handling apparatus to finish the heat treatment.

The present invention will be specifically explained hereafter with reference to the following examples of the present invention and comparative examples. However, the present invention is not limited by these.

Example 1, Comparative Example 1

Figure 3:
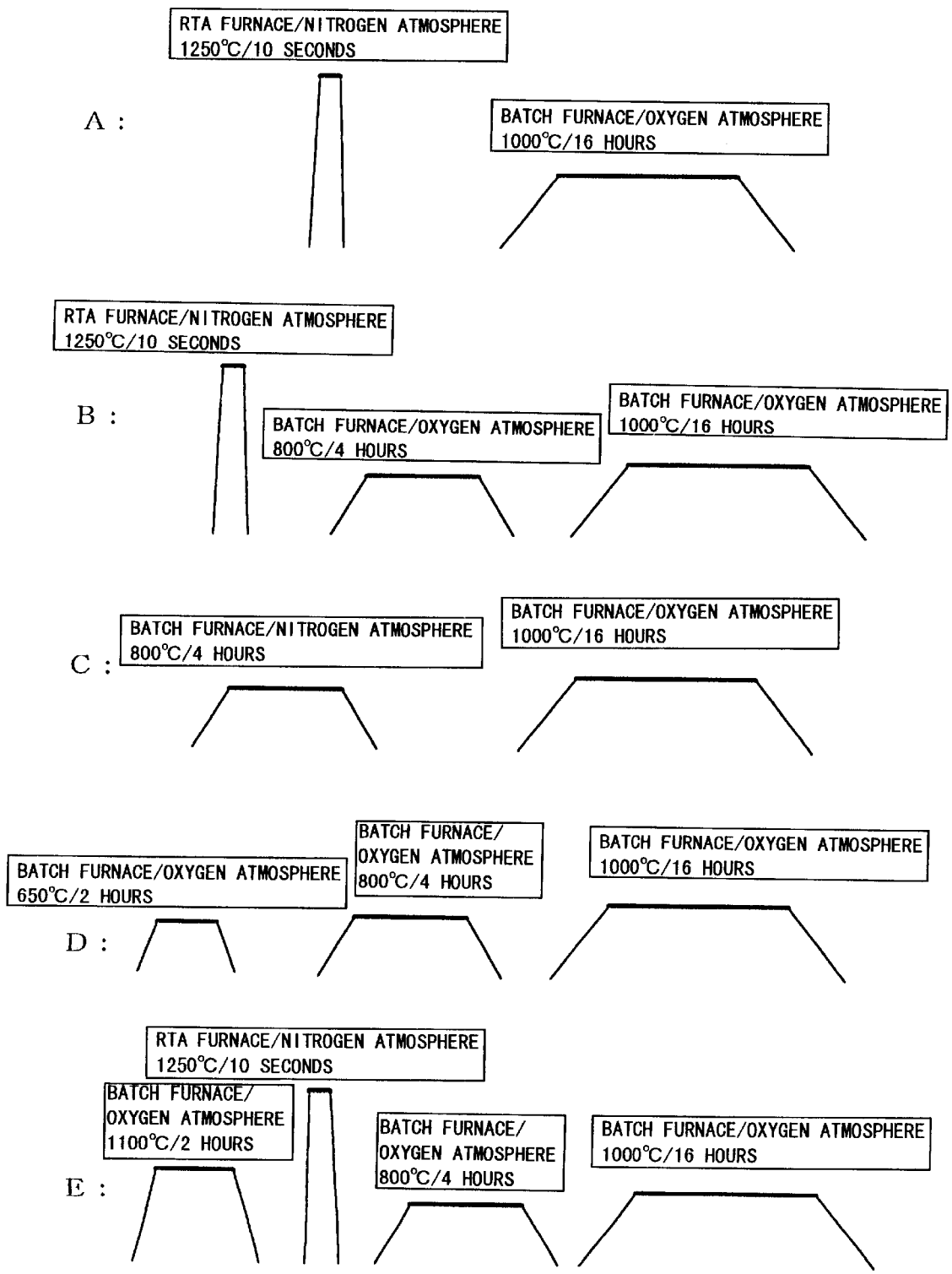
FIGS. 3A to 3E are views showing the oxygen precipitation heat treatment conditions of Example 1 and Comparative Example 1.

Five silicon single crystal ingots were pulled by the CZ method, which had an orientation of <100>, diameter of 200 mm, conductivity type of P-type, resistivity of 100 Ω·cm or higher and initial interstitial oxygen concentration of 10 to 25 ppma (JEIDA), and sliced into wafers. These wafers were subjected to five kinds of oxygen precipitation heat treatments (A, B, C, D, E) represented in FIG. 3.

Resistivity and residual interstitial oxygen concentration of each wafer were measured after each of the five kinds of oxygen precipitation heat treatments. Then, in order to determine the influence of the oxygen donor formation when the wafers were subjected to a device production heat treatment, each wafer was subjected to a heat treatment at 450° C. for 16 hours, which simulated a device production heat treatment, and resistivity of each wafer was measured again.

The resistivity measurement was carried out by the four-point probe method, and the interstitial oxygen concentration measurement was carried out by using QS-300 produced by BioRad, which is a measurement apparatus based on infrared spectroscopy.

The measurement results are shown in Table 1 and FIG. 1. FIG. 1 shows the relationship between the residual interstitial oxygen concentration after each oxygen precipitation heat treatment and the resistivity before and after the device production heat treatment. In FIG. 1, the notation of 1.0E+05 for the vertical axis means $1.0 \times 10^5$, for example.

TABLE 1

| Precipitation heat treatment | Oxygen concentration (ppma-JEIDA) | | Resistivity (Ω· cm) | |
|---|---|---|---|---|
| | Initial interstitial oxygen | Residual interstitial oxygen | Before device production heat treatment | After device production heat treatment |
| A | 20 | 6.5 | 15000 | 8000 |
| | 18 | 7.5 | 23000 | 9000 |
| | 15 | 10 | 20000 | 80 |
| | 13 | 12 | 5000 | 7 |
| | 12 | 11 | 4500 | 6 |
| B | 20 | 4.5 | 17000 | 9000 |
| | 18 | 4.5 | 15000 | 3000 |
| | 15 | 6 | 23000 | 8300 |
| | 13 | 7 | 1100 | 200 |
| | 12 | 7 | 1000 | 210 |
| C | 20 | 11 | 6000 | 20 |
| | 18 | 16 | 6200 | 7 |
| | 15 | 14.5 | 8000 | 6 |

TABLE 1-continued

| Precipitation heat treatment | Oxygen concentration (ppma-JEIDA) | | Resistivity (Ω· cm) | |
|---|---|---|---|---|
| | Initial interstitial oxygen | Residual interstitial oxygen | Before device production heat treatment | After device production heat treatment |
| | 13 | 13 | 3000 | 4 |
| | 12 | 12 | 3000 | 4 |
| D | 20 | 4.5 | 9000 | 6000 |
| | 18 | 7 | 8000 | 350 |
| | 15 | 13 | 7000 | 6 |
| | 13 | 12.5 | 10000 | 5 |
| | 12 | 11.5 | 9000 | 4 |
| E | 20 | 4.5 | 1500 | 2500 |
| | 18 | 5 | 1100 | 2000 |
| | 15 | 6 | 1000 | 800 |
| | 13 | 7 | 1200 | 250 |
| | 12 | 6.5 | 1100 | 300 |

As demonstrated by the results shown in Table 1 and FIG. 1, it can be seen that, if the residual interstitial oxygen concentration was about 8 ppma or lower irrespective of the initial interstitial oxygen concentration and the heat treatment conditions of the oxygen precipitation heat treatment, the reduction in the resistivity after the device production heat treatment was very small and a resistivity of 100 Ω·cm or higher was surely maintained, because the amount of generated oxygen donors was small.

On the other hand, when the residual interstitial oxygen concentration exceeded 10 ppma, the resistivity after the device production heat treatment was markedly reduced. That is, it is clear that, if such a wafer is subjected to a device production heat treatment at a temperature of 350 to 500° C. such as those for electrode wiring process and so forth, which is likely to form oxygen donors, it cannot maintain the high resistivity.

In Table 1, those showing a decreased resistivity after the heat treatment compared with that observed before the heat treatment correspond to those of which conductivity type was converted from P-type to N-type due to the generation of oxygen donors. On the other hand, those showing an increased resistivity correspond to those maintaining the high resistivity while remaining in P-type. Therefore, it can be seen that, according to the present invention, it is also possible to prepare a high resistivity CZ silicon wafers of P-type by suitably selecting the initial oxygen concentration, the conditions of the precipitation heat treatment and so forth.

Example 2, Comparative Example 2

Figure 2:
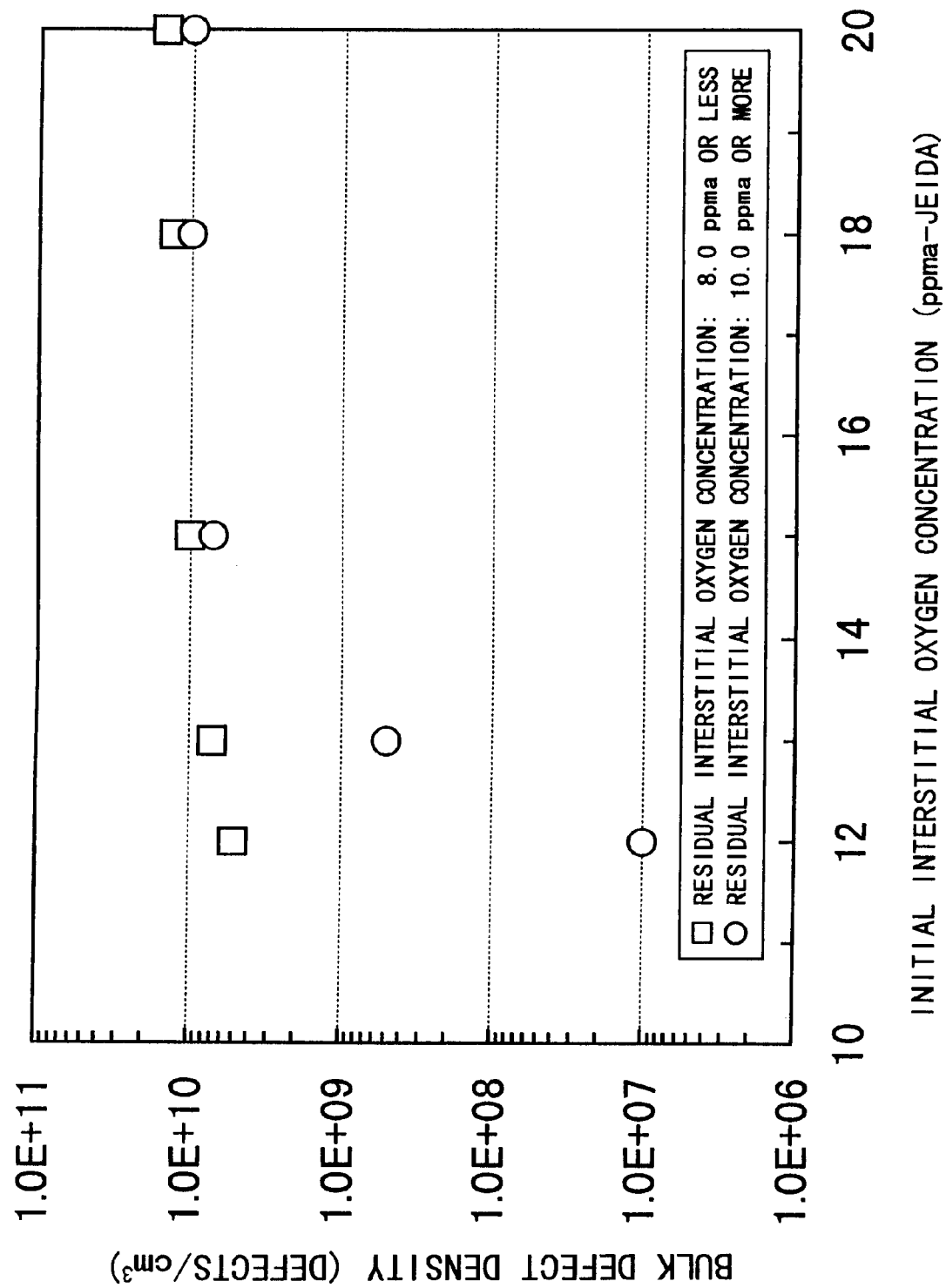
FIG. 2 is a view showing relationship between the initial interstitial oxygen concentration and the bulk defect density of a silicon wafer.

The bulk defect density of the silicon wafers used in Example 1 and Comparative Example 1 was measured by infrared interference method. OPP (Optical Precipitate Profiler) produced by BioRad was used as the measurement apparatus, and an internal region within a depth of 90 μm from the surface was observed. The bulk defect density obtained by this evaluation method is a density of oxide precipitates or stacking faults, but most of them consist of oxide precipitates. The measurement results are shown in FIG. 2. FIG. 2 shows the relationship between the initial interstitial oxygen concentration and the bulk defect density of a silicon wafer.

From the results shown in FIG. 2, it can be seen that the CZ silicon wafer of the present invention of which residual interstitial oxygen concentration was made to be 8 ppma or less by the oxygen precipitation heat treatment had a high density of bulk defects of $1\times10^9$ defects/cm$^3$ or more, even though it had a relatively low initial interstitial oxygen concentration of 13 ppma or less. This is because the residual interstitial oxygen concentration was made to be 8 ppma or less by the proper oxygen precipitation heat treatment so that sufficient oxide precipitates should be generated. That is, the produced silicon wafer of the present invention can be a wafer having a maintained high resistivity and high gettering effect.

On the other hand, it can be seen that the conventional silicon wafer of which residual interstitial oxygen concentration became 10 ppma or more could have a high density of bulk defects when the initial interstitial oxygen concentration was high, but the bulk defect density was reduced to less than $1\times10^9$ defects/cm$^3$, when the initial interstitial oxygen concentration became low.

That is, as shown in Comparative Example 1, if the residual interstitial oxygen concentration is high like conventional silicon wafers, a high resistivity cannot be maintained. Then, if it is attempted to maintain the high resistivity by lowering the initial interstitial oxygen concentration like the conventional methods, the gettering effect should inevitably become low. That is, in the conventional silicon wafers, it is impossible to reconcile retention of a high resistivity and high gettering effect.

Example 3

A wafer produced by the CZ method and having orientation of <100>, diameter of 150 mm, conductivity type of P-type, planar distribution of resistivity within the range of 4400–7000 Ω·cm and initial interstitial oxygen concentration of about 17.9 ppma was prepared as a base wafer. A bond wafer having the same diameter, orientation and conductivity type as the base wafer, resistivity of 10–20 Ω·cm and initial interstitial oxygen concentration of 15 ppma was prepared.

A thermal oxide film was formed with a thickness of 400 nm on the surface of the bond wafer, and then hydrogen ions were implanted through this thermal oxide film (implantation energy: 100 keV, dose: $8\times10^{16}$/cm$^2$). Then, this bond wafer was brought into close contact with the base wafer at room temperature, and subjected to a heat treatment at 500° C. for 30 minutes to delaminate the bond wafer at the hydrogen ion-implanted layer. Thus, a bonded SOI wafer having an SOI layer with a thickness of about 0.4 μm was produced.

Then, the wafer was subjected to a three-step heat treatment under the same conditions as the heat treatment D of Example 1, which serves as both of a bonding heat treatment for enhancing bonding strength and the oxygen precipitation heat treatment of the base wafer, and then the oxide film on the back surface of the SOI wafer was removed by etching. Thereafter, residual interstitial oxygen concentration and resistivity of the base wafer were measured. As a result, residual interstitial oxygen concentration of the base wafer was about 5.4 ppma, and resistivity was in the range of 4000–6300 Ω·cm. Thus, it was found that a high resistivity of the same level as the initial resistivity was maintained.

Further, this SOI wafer was subjected to a heat treatment at 450° C. for 16 hours and resistivity of the base wafer was measured again. It was found that a high resistivity of 3000 Ω·cm or more was maintained even though the wafer was heat-treated at a temperature that was likely to generate oxygen donors.

Example 4

A silicon single crystal ingot was prepared by the CZ method and sliced into a wafer by using a wire saw. Then, the wafer was subjected to usually used processes such as chamfering, lapping and chemical etching to prepare a CW having a diameter of 150 mm, orientation of <100>, conductivity type of P-type, resistivity of about 11200 Ω·cm and initial oxygen concentration of 17.6 ppma, and used as a base wafer. When this CW was produced, a donor annihilation heat treatment, which is generally performed in a usual CW production process, was not performed.

Further, as a bond wafer, a mirror-polished wafer having a diameter of 150 mm, orientation of <100>, conductivity type of P-type, resistivity of 10 to 20 Ω·cm and initial oxygen concentration of about 15 ppma was prepared, and a thermal oxide film was formed on the surface of this bond wafer with a thickness of 500 nm.

The CW prepared as the base wafer was subjected to a first step heat treatment (500° C., 4 hours, nitrogen atmosphere) and a second step heat treatment (800° C., 6 hours, nitrogen atmosphere) as a part of three-step heat treatment for oxygen precipitation heat treatment, and then one side surface was subjected to a three-step polishing (primary polishing, secondary polishing, polishing for finish (final polishing)) to obtain a mirror-polished wafer.

Then, the mirror surfaces of the bond wafer and the base wafer were brought into close contact with each other via the oxide film at room temperature, and subjected to a heat treatment at 1100° C. for 10 hours (pyrogenic oxidation) as a heat treatment for enhancing the bonding strength, which also served as a third step heat treatment of the oxygen precipitation heat treatment. Thereafter, the bond wafer was made into a thin film by grinding and polishing to prepare an SOI wafer having an SOI layer with a thickness of about 5 μm.

The oxide film on the back surface of the base wafer of the produced SOI wafer was removed by etching, and residual interstitial oxygen concentration, resistivity and bulk defect density of the base wafer were measured. Furthermore, this SOI wafer was subjected to a high temperature heat treatment at 1200° C. for 30 minutes as the first step of the device production heat treatment, and then it was subjected to a heat treatment at 450° C. for 5 hours. Then, the residual interstitial oxygen concentration, resistivity and bulk defect density of the base wafer were measured again. The results are shown in Table 2.

TABLE 2

|  | Initial stage | After bonding heat treatment | After device heat treatment |
| --- | --- | --- | --- |
| Resistivity, Conductivity type | 11200 Ω · cm P-type | 9980 Ω · cm N-type | 3520 Ω · cm N-type |
| Interstitial oxygen concentration | 17.6 ppma | 7.2 ppma | 7.2 ppma |
| Oxide precipitate density | — | $1.05 \times 10^{10}$/cm$^3$ | $1.05 \times 10^{10}$/cm$^3$ |

From the above results, it can be seen that the base wafer of the SOI wafer according to the present invention after the bonding heat treatment contained oxide precipitates at a high density and maintained a high resistivity which is comparable to the initial resistivity. Further, it was found that, even though it was subjected to the high temperature heat treatment at 1200° C. as the first step for simulating a device production heat treatment, increase of interstitial oxygen due to dissolution of oxide precipitates was not observed. Further, even after the subsequent heat treatment at 400° C. for 5 hours, it was found to still maintain a high resistivity of 3000 Ω·cm or more, although the resistivity was slightly reduced.

Example 5, Comparative Example 3

A plurality of silicon single crystal ingots were pulled by the CZ method, which ingots had an orientation of <100>, diameter of 200 mm, conductivity type of P-type, resistivity of 10–10000 Ω·cm and initial interstitial oxygen concentration of 10 to 25 ppma, and processed into wafers. After resistivity and initial interstitial oxygen concentration of these wafers were measured, they were subjected to the same three-step heat treatment as the oxygen precipitation heat treatment D (refer to FIG. 3) performed in Example 1 and Comparative Example 1.

After the above heat treatment was performed, residual interstitial oxygen concentration, oxide precipitate density, and size and shape of oxide precipitates were determined. As for the measurement of each item, size and shape of precipitates were determined by a transmission electron microscope, precipitate density was measured by the aforementioned OPP method, and the other measurement was performed in the same manner as in Example 1 and Example 2.

Furthermore, in order to compare anti-slip property, other wafers produced with the same conditions as the wafers for which the above measurements were performed were subjected to a heat treatment at a temperature of 1100° C., 1150° C. or 1200° C. for 2 hours, and generation of slip was investigated by X-ray topography. The results are shown in Table 3, which also shows the results of the aforementioned measurements.

not suffer from the generation of slip, even though they had an oxide precipitate density of $1\times10^8$ to $2\times10^{10}$ precipitates/$cm^3$ and oxide precipitates having a size of 200 nm or more for polyhedrons or 230 nm or more for plates.

On the other hand, it can be seen that a wafer having a residual oxygen concentration exceeding 8 ppma after the oxygen precipitation treatment suffered from the generation of slip after they were subjected to a high temperature heat treatment at 1100° C. or higher, even if they had an initial interstitial oxygen concentration of 10 to 25 ppma.

The present invention is not limited to the embodiments described above. The above-described embodiments are mere examples, and those having the substantially same structure as that described in the appended claims and providing the similar functions and advantages are included in the scope of the present invention.

For example, the aforementioned embodiments were explained for the production of silicon wafers having a diameter of 200 mm. However, the present invention can be used irrespective of the wafer diameter in principle, and it can also be applied to silicon wafers having a diameter of, for example, 100 to 400 mm or larger.

What is claimed is:

1. A silicon wafer which is produced by subjecting a silicon wafer having a resistivity of 100 Ω·cm or more and an initial interstitial oxygen concentration of 10 to 25 ppma to an oxygen precipitation heat treatment and has a residual interstitial oxygen concentration of 8 ppma or less.

2. A silicon wafer having a resistivity of 100 Ω·cm or more and an initial interstitial oxygen concentration of 10 to 25 ppma, and maintaining resistivity of 100 Ω·cm or more after a device production heat treatment at 350 to 500° C.

3. The silicon wafer according to claim 1, which has a bulk defect density of $1\times10^8$ to $2\times10^{10}$ defects/$cm^3$ after a gettering heat treatment or a device production heat treatment.

4. The silicon wafer according to claim 2, which has a bulk defect density of $1\times10^8$ to $2\times10^{10}$ defects/$cm^3$ after a gettering heat treatment or a device production heat treatment.

TABLE 3

| Resistivity | Initial interstitial oxygen concentration | Residual interstitial oxygen concentration | Oxide precipitate density | Oxide precipitate size in average (nm) | | Heat treatment temperature | Generation of |
|---|---|---|---|---|---|---|---|
| (Ω·cm) | (ppma) | (ppma) | (× $10^{10}$/$cm^3$) | Polyhedron | Plate | (° C.) | slip |
| 15.79k | 17.8 | 5.1 | 1.42–1.65 | 150 | – | 1200 | Not observed |
| 18.74k | 17.9 | 5.1 | 1.41–1.61 | 190 | 300 | 1150 | Not observed |
| 18.51k | 17.8 | 5.0 | 1.51–1.56 | 204 | 400 | 1100 | Not observed |
| 9.15k | 17.7 | 5.4 | 0.40–0.45 | 206 | 400 | 1100 | Not observed |
| 21.45k | 17.7 | 5.2 | 0.37–0.42 | 210 | 370 | 1100 | Not observed |
| 9.70k | 17.7 | 5.3 | 0.30–0.39 | 222 | – | 1100 | Not observed |
| 12.18k | 17.2 | 6.0 | 0.33–0.47 | 212 | – | 1100 | Not observed |
| 9.00k | 17.5 | 5.9 | 0.35–0.50 | 300 | 500 | 1100 | Not observed |
| 10 | 18.0 | 6.0 | 1.5–2.0 | 235 | 400 | 1100 | Not observed |
| 50 | 18.1 | 6.1 | 1.5–2.0 | 215 | 400 | 1100 | Not observed |
| 100 | 18.0 | 5.9 | 1.5–2.0 | 220 | 400 | 1100 | Not observed |
| 7.0k | 15.0 | 13.0 | <0.01 | – | – | 1100 | Observed |
| 10.0k | 13.0 | 12.5 | <0.01 | – | – | 1200 | Observed |
| 50 | 14.0 | 13.0 | <0.01 | – | – | 1100 | Observed |
| 20 | 14.5 | 13.5 | <0.01 | – | – | 1150 | Observed |

From the results shown in Table 3, it can be seen that, if a wafer had an initial interstitial oxygen concentration of 10 to 25 ppma and a residual interstitial oxygen concentration of 8 ppma or less, slip dislocations were not generated even if it was subjected to a heat treatment at 1100° C. or higher, irrespective of the magnitude of resistivity before the heat treatment. Further, it can be confirmed that these wafers did 5. A silicon wafer having a resistivity of 100 Ω·cm or more, an interstitial oxygen concentration of 8 ppma or less and a bulk defect density of $1\times10^8$ to $2\times10^{10}$ defects/$cm^3$.

6. A bonded SOI wafer which utilizes the silicon wafer according to claim 1, as a base wafer.

7. A bonded SOI wafer which utilizes the silicon wafer according to claim 2, as a base wafer.

8. A bonded SOI wafer which utilizes the silicon wafer according to claim 4, as a base wafer.

9. A silicon wafer having an interstitial oxygen concentration of 8 ppma or less and an oxide precipitate density of $1\times10^8$ to $2\times10^{10}$ precipitates/cm$^3$ in the wafer.

10. The silicon wafer according to claim 9, wherein the interstitial oxygen concentration is 6 ppma or less.

11. The silicon wafer according to claim 9, wherein the oxide precipitates in the silicon wafer are polyhedrons having a size of 200 nm or more or plates having a size of 230 nm or more.

12. The silicon wafer according to claim 10, wherein the oxide precipitates in the silicon wafer are polyhedrons having a size of 200 nm or more or plates having a size of 230 nm or more.

13. An epitaxial wafer comprising an epitaxial layer formed on a surface of a silicon wafer according to claim 1.

14. An epitaxial wafer comprising an epitaxial layer formed on a surface of a silicon wafer according to claim 2.

15. An epitaxial wafer comprising an epitaxial layer formed on a surface of a silicon wafer according to claim 5.

16. An epitaxial wafer comprising an epitaxial layer formed on surface of a silicon wafer according to claim 9.

17. A method for producing a bonded SOI wafer which comprises a step of bringing a bond wafer into close contact with a base wafer via an oxide film, a step of subjecting them to a bonding heat treatment so that the both should be firmly bonded, and a step of making the bond wafer into a thin film as an SOI layer, wherein a silicon wafer having a resistivity of 100 Ω·cm or more and an initial interstitial oxygen concentration of 10 to 25 ppma is used as the base wafer, and a heat treatment that can provides a residual interstitial oxygen concentration in the base wafer of 8 ppma or less is performed as the bonding heat treatment.

18. The method for producing a bonded SOI wafer according to claim 17, wherein the base wafer to be used is a wafer subjected to at least a part of the oxygen precipitation heat treatment before the step of bringing the bond wafer into close contact with the base wafer.

19. The method for producing a bonded SOI wafer according to claim 18, wherein at least a part of the oxygen precipitation heat treatment performed for the base wafer is performed before final polishing of the base wafer.

20. A method for producing a silicon wafer, which comprises growing a silicon single crystal ingot having a resistivity of 100 Ω·cm or more and an initial interstitial oxygen concentration of 10 to 25 ppma by the Czochralski method, processing the silicon single crystal ingot into a wafer, and subjecting the wafer to an oxygen precipitation heat treatment to provide a residual interstitial oxygen concentration of 8 ppma or less.

21. A method for producing a silicon wafer, which comprises growing a silicon single crystal ingot having an initial interstitial oxygen concentration of 10 to 25 ppma by the Czochralski method, processing the silicon single crystal ingot into a wafer, and subjecting the wafer to an oxygen precipitation heat treatment, which is carried out by performing a high temperature heat treatment at 1100° C. or higher in the first step to out-diffuse the interstitial oxygen in a surface layer of the wafer and form a denuded zone (DZ) layer on the wafer surface to provide a residual interstitial oxygen concentration of 8 ppma or less.

22. The method for producing a silicon wafer according to claim 21, wherein the oxygen precipitation heat treatment is performed to provide a residual interstitial oxygen concentration of 6 ppma or less.

23. The method for producing a silicon wafer according to claim 22, wherein the oxygen precipitation heat treatment for the silicon wafer is performed before the final polishing of the wafer.

24. A silicon wafer produced by the production method according to claim 21.

* * * * *